(12) United States Patent
Ryu et al.

(10) Patent No.: US 10,943,944 B2
(45) Date of Patent: Mar. 9, 2021

(54) FLAT PANEL DISPLAY HAVING EMBEDDED OPTICAL IMAGING SENSOR LOCATED AT REAR SURFACE OF DISPLAY

(71) Applicant: LG Display Co., Ltd., Seoul (KR)

(72) Inventors: Seungman Ryu, Paju-si (KR); Hoon Kang, Goyang-si (KR); Joobong Hyun, Seoul (KR); Jinhyuk Jang, Busan (KR); Ara Yoon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 224 days.

(21) Appl. No.: 15/826,075

(22) Filed: Nov. 29, 2017

(65) Prior Publication Data

US 2018/0190710 A1     Jul. 5, 2018

(30) Foreign Application Priority Data

Nov. 30, 2016  (KR) .................. 10-2016-0161668

(51) Int. Cl.
*H01L 27/14*      (2006.01)
*H01L 27/146*     (2006.01)
*H01L 25/16*      (2006.01)
*H01L 27/15*      (2006.01)
(Continued)

(52) U.S. Cl.
CPC ...... *H01L 27/14678* (2013.01); *H01L 25/167* (2013.01); *H01L 27/14618* (2013.01); *H01L 27/14627* (2013.01); *H01L 27/14636* (2013.01); *H01L 27/15* (2013.01); *H01L 27/3234* (2013.01); *H01L 23/4985* (2013.01)

(58) Field of Classification Search
CPC ........... H01L 27/14678; H01L 27/3225; H01L 27/3234; G06K 9/004; G06K 9/0004; G02F 1/13338; G06F 3/0414
See application file for complete search history.

(56) References Cited

U.S. PATENT DOCUMENTS

2015/0187980 A1*  7/2015  Yamamoto ................. G06F 1/00
                                                        250/552
2016/0218153 A1*  7/2016  Kim ........................... G09G 3/00
(Continued)

FOREIGN PATENT DOCUMENTS

CN    103942537 A    7/2014
CN    104882457 A    9/2015
CN    105550662 A    5/2016
(Continued)

OTHER PUBLICATIONS

Chinese Office action dated Sep. 3, 2019 issued in a Chinese patent application No. 201711228182.8. (6 pages) and English translation (9 pages).

*Primary Examiner* — Shaun M Campbell
*Assistant Examiner* — Suberr L Chi
(74) *Attorney, Agent, or Firm* — Polsinelli PC

(57) ABSTRACT

The present disclosure relates to a flat panel display embedding an optical imaging sensor such as a fingerprint image sensor. The present disclosure provides a flat panel display embedding an optical image sensor comprising: a display panel including a display area and a sensing area defined in the display area; a barrier plate having a light transparent area corresponding to the sensing area and disposed at a rear surface of the display panel; and a light sensor disposed under the barrier plate corresponding to the light transparent area.

23 Claims, 3 Drawing Sheets

(51) Int. Cl.
*H01L 27/32* (2006.01)
*H01L 23/498* (2006.01)

(56) References Cited

U.S. PATENT DOCUMENTS

2017/0124372 A1* 5/2017 Evans, V ............. G06K 9/0002
2017/0300736 A1* 10/2017 Song .................. G06K 9/00033

FOREIGN PATENT DOCUMENTS

CN 205643973 U 10/2016
JP 2001351099 A 12/2001

* cited by examiner

FLAT PANEL DISPLAY HAVING EMBEDDED OPTICAL IMAGING SENSOR LOCATED AT REAR SURFACE OF DISPLAY

CROSS-REFERENCE TO RELATED APPLICATION

This application claims the benefit of Korea Patent Application No. 10-2016-0161668 filed on Nov. 30, 2016, which is incorporated herein by reference in its entirety for all purposes as if fully set forth herein.

BACKGROUND

Field of the Disclosure

The present disclosure relates to a display device, and more particularly, to a flat panel display embedding an optical imaging sensor such as a fingerprint image sensor. Especially, the present disclosure relates to an organic light emitting diode display having an optical image sensor attached on the rear surface of the display.

Description of the Background

Various computer based systems including a notebook computer, a tablet personal computer (or, PC), a smart phone, personal digital assistants, automated teller machines and/or search information system have been developed. As these devices use and store the various personal information as well as the business information and the confidential information, it is required to strength the securities for preventing these important data being leaked.

To do so, one method has been suggested for strengthening the security using an image sensor recognizing the authorized user's biological information. For example, the fingerprint sensor is generally used for enhancing the security when registering and authenticating are performed. The fingerprint sensor is for sensing the fingerprint of user. The fingerprint sensor may be categorized into an optical fingerprint sensor and a capacitive fingerprint sensor.

The optical fingerprint sensor uses a light source such as a light emitting diode (or LED) to irradiate lights and detects the lights reflected by ridges of the fingerprint using a CMOS (or, complementary metal oxide semiconductor) image sensor. As the optical fingerprint sensor scans the fingerprint using the LED lights, it is required that the sensor is equipped with an additional device for performing the scan process. There is a limitation to increasing the size of the object for scanning the image. Therefore, there are limitations to applying the optical fingerprint sensor to various applications such as combining with the display devices.

For conventional optical fingerprint sensors, known are a Korean patent 10-060817 registered on Jun. 26, 2006 of which title is "A display apparatus having fingerprint identification sensor" and a Korean patent application 10-2016-0043216 published on Apr. 21, 2016 of which title is "Display device including fingerprinting device".

The above mentioned optical fingerprint sensors use the display area as the touch area for inputting the user's selection and the sense area for sensing the fingerprint. However, this optical fingerprint sensor uses the diffused (or diverged) lights having very low directivity. Therefore, there is a limitation to recognizing the exact fingerprint pattern. When using the collimated lights such as the infrared laser having high directivity, it is difficult to generating the sensing lights as covering the wider area. Therefore, the fingerprint sensing area is restricted in small area. In order to radiate the collimated lights over the wider scan area, specific scanning structure is required, so that this system is not suitable for portable or personal display apparatus.

Therefore, for portable devices embedding the fingerprint sensor, the capacitive fingerprint sensor is mainly used. However, the capacitive fingerprint sensor also has many problems.

The capacitive fingerprint sensor detects the difference of the electricity between the ridges and the valleys of the fingerprint contacting on the fingerprint sensor. For conventional capacitive fingerprint sensors, known is a US patent application 2013/0307818 published on Nov. 21, 2013 of which title is "Capacitive Sensor Packaging".

The above mentioned capacitive fingerprint sensor is an assembly type sensor embedding with a specific push button. It has a capacitive plate and a silicon wafer having a circuit for detecting the capacitive storage between the ridges and valleys of the fingerprint. Generally, as the sizes of the ridges and valleys of the fingerprint are very tiny, about 300~500 µm (micrometer), the capacitive fingerprint sensor needs a high resolution sensor array and an integrated chip (or IC) for processing the fingerprint detection. To do so, the silicon wafer should include a sensor array and an IC on one substrate.

However, when the high resolution sensor array and the IC are formed on the same silicon wafer, an assembly structure is required for joining the push button with the fingerprint sensor. Therefore, the structure becomes complex and further the non-display area (or bezel area) is increased. In some cases, the push button (i.e., the home key of the smart phone) overlaps the fingerprint sensor, so that the thickness of the whole device becomes too thick. Further, the sensing area for the fingerprint is dependent on the size of the push button.

To solve above mentioned problems and limitations, some technologies have been suggested in which the touch sensor area is used as for sensing the fingerprint. For example, known are a U.S. Pat. No. 8,564,314 registered on Oct. 22, 2013 of which title is "Capacitive touch sensor for identifying a fingerprint", and a Korean patent 10-1432988 registered on Aug. 18, 2014 of which title is "A capacitive touch screen for integrated of fingerprint recognition".

In general cases of the personal portable devices such as the smart phones, an additional transparent film is attached for protecting the display glass panel. When the above mentioned technologies are applied to the personal portable devices, as attaching the protective film thereon, the precise performance for sensing or recognizing the fingerprint can be substantially degraded. In general, even though the protective film is attached, the touch function may be properly operated. However, the detection capability for the difference of the capacitive storage amount for sensing the fingerprint can be deteriorated by the protective film even though its thickness is very thin.

For a display embedding the capacitive fingerprint sensor, generally a protective film or a hardening glass may be further attached on the cover glass of the display. In that case, the recognition capability can be deteriorated. That is, the total thickness of the cover glass may affect the sensitivity of the capacitive fingerprint sensor. In the interim, the diffused light used in the sensing light source may affect the sensitivity of the optical fingerprint sensor. When using the collimated lights for enhancing the sensitivity of the optical fingerprint sensor, the bulky and/or complex optical devices are required so that it is difficult to apply to a display for personal mobile device.

SUMMARY

In order to overcome the above mentioned drawbacks, the purpose of the present disclosure is to suggest a flat panel display embedding an optical image sensor (or an optical image recognition apparatus). Another purpose of the present disclosure is to suggest a flat panel display such as an organic light emitting diode display having an optical image sensor at the rear surface of the display, for recognizing an image disposed on the front surface of the display.

In order to accomplish the above purpose, the present disclosure provides a flat panel display embedding an optical image sensor comprising: a display panel including a display area and a sensing area defined in the display area; a barrier plate having a light transparent area corresponding to the sensing area and disposed at a rear surface of the display panel; and a light sensor disposed under the barrier plate corresponding to the light transparent area.

In one aspect, the light transparent area has a window shape or a well shape by removing some portions of the barrier plate corresponding to the sensing area.

In one aspect, the display further comprising: a lens film including a condensing lens disposed as corresponding to the sensing area, wherein the lens film is disposed between the display panel and the barrier plate.

In one aspect, the light sensor is attached on an inside bottom surface of a vessel having a condensing lens at an upper side of the vessel.

In one aspect, the display further comprising: a flexible circuit board of which one side is attached at one side of the display panel for sending electric signals, wherein the light sensor is mounted on the flexible circuit board and disposed as corresponding to the light transparent area.

In one aspect, the display further comprising: a cover plate disposed on an upper surface of the display panel.

In one aspect, the display further comprising: a light source for sensing an image disposed at one side of the cover plate.

In one aspect, the light transparent area is filled with a material having lower refractive index than the barrier plate.

In one aspect, the display panel includes any one of an organic light emitting diode display and an inorganic light emitting diode display.

In one aspect, the sensing area includes a first sensing area and a second sensing area; the light transparent area includes a first light transparent area corresponding to the first sensing area, and a second light transparent area corresponding to the second sensing area; and the light sensor includes a first light sensor disposed as corresponding to the first light transparent area, and a second light sensor disposed as corresponding to the second light transparent area.

In one aspect, the display further comprising lens film disposed between the display panel and the barrier plate, wherein the lens film includes: a first condensing lens disposed as corresponding to the first sensing area; and a second condensing lens disposed as corresponding to the second sensing area.

The present disclosure provides a flat panel display embedding an optical image sensor comprising a flat display panel and a photo sensor disposed at the rear side of the display panel. The image of an object disposed on the front surface of a self-luminance type display panel can be reproduced by detecting the reflected lights from the object.

The present disclosure provides a flat panel display embedding an optical image sensor in which the photo sensor is not placed into the display panel and the display area can be used as the image sensing area. Further, the whole display panel can be used for the image sensing area so that the design freedom for the flat panel display embedding an optical image sensor is very high. Disposing the photo sensor at the rear side of the display panel, the location of the photo sensor is not restricted. Using an ultra-thin type optical image sensor, the flat panel display embedding an optical image sensor without any increasing of thickness, size and/or weight is acquired.

In another aspect, the present disclosure provides a flat panel display having an integrated optical image sensor comprising a display panel including a display area and a sensing area in the display area; a barrier plate including a light barrier area corresponding to outside the sensing area and disposed at a non-image displaying surface of the display panel; a condensing efficiency enhancing area in a space of the barrier plate corresponding to the sensing area; and a light sensor corresponding to the condensing efficiency enhancing area.

In a further aspect, the present disclosure provides a portable electronic device having an integrated optical image sensor comprising a display panel including a display area and a sensing area in the display area; a barrier plate including a light barrier area corresponding to outside the sensing area and disposed at a non-image displaying surface of the display panel; one or more condensing efficiency enhancing areas in a space of the barrier plate corresponding to the sensing area, wherein the one or more condensing efficiency enhancing areas are at least partially transparent with respect to light and have a lower refractive index than the barrier plate; and a light sensor corresponding to the one of more condensing efficiency enhancing areas.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
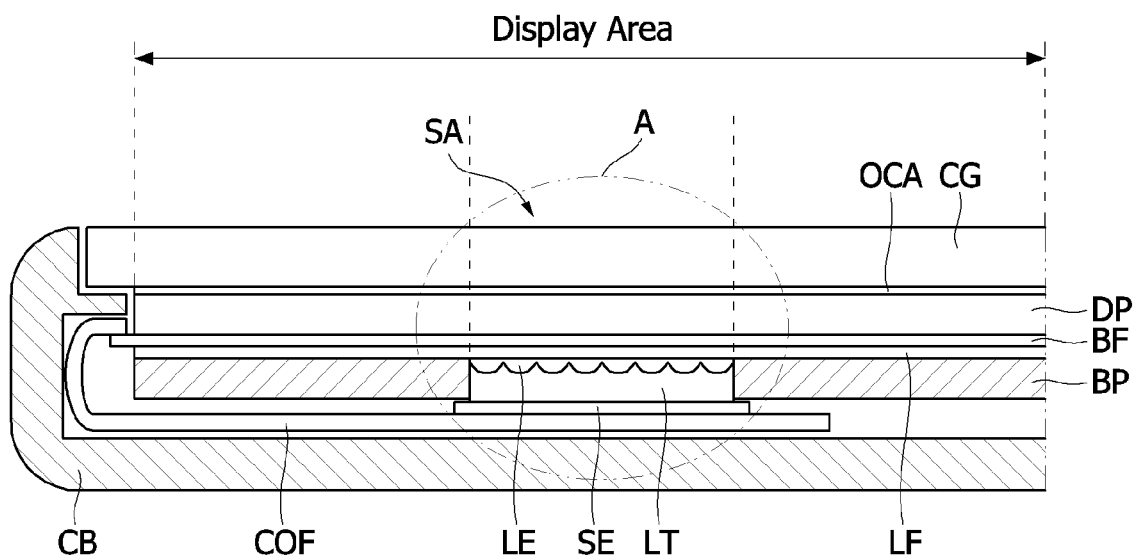
FIG. 1 is a cross-sectional view illustrating a structure of an organic light emitting diode display embedding an optical image sensor according to a first aspect of the present disclosure.

Referring to attached figures, we will explain various aspects of the present disclosure. Like reference numerals designate like elements throughout the detailed description. However, the present disclosure is not restricted by these aspects but can be applied to various changes or modifications without changing the technical spirit. In the following aspects, the names of the elements are selected by considering the easiness for explanation so that they may be different from actual names.

<First Aspect>

Figure 2:
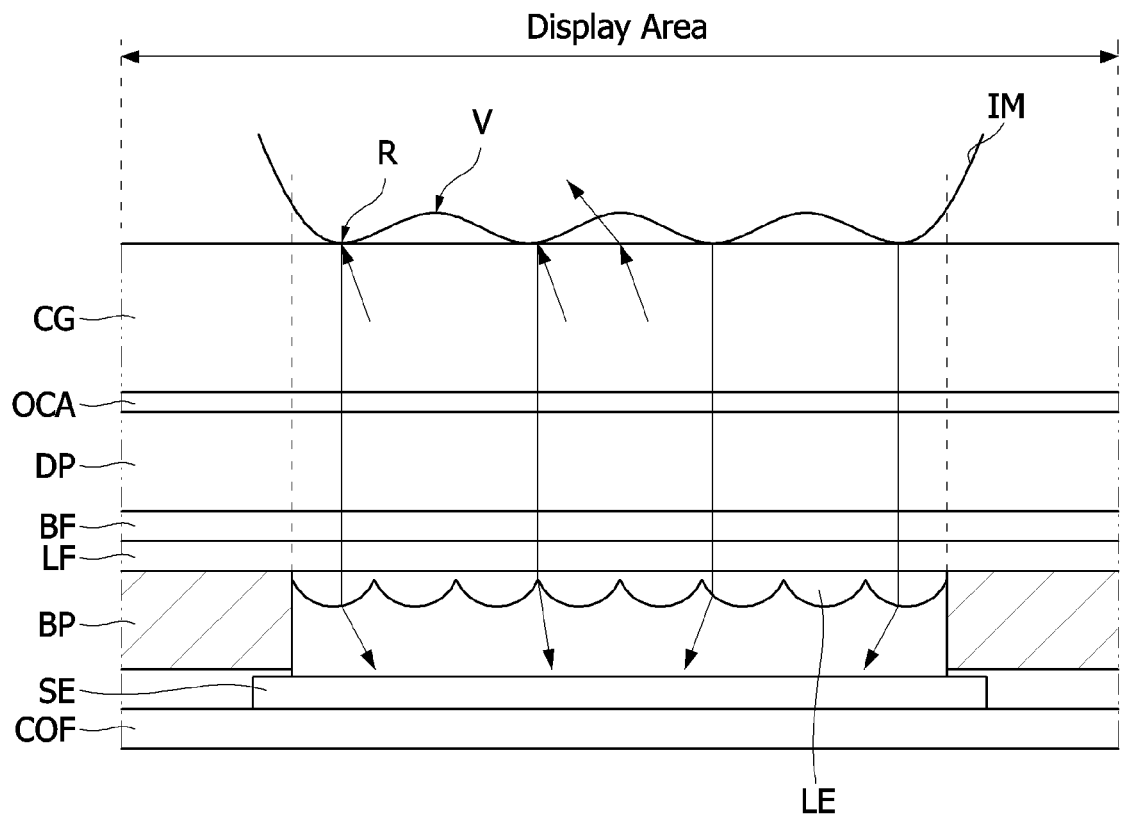
FIG. 2 is a cross-sectional view illustrating the mechanism for recognizing a finger print at the organic light emitting diode display embedding an optical image sensor shown in FIG. 1.

Hereinafter, a first aspect of the present disclosure is described with reference to FIGS. 1 and 2. FIG. 1 is a cross-sectional view illustrating a structure of an organic light emitting diode display embedding an optical image sensor according to the first aspect of the present disclosure.

Referring to FIG. 1, a flat panel display embedding an optical image sensor according to the first aspect comprises a display panel DP and a light sensor (or photo sensor) SE disposed at the rear side (or non-image displaying side) of the display panel DP. The display panel DP may include a self-luminance type display panel such as an organic light emitting diode display panel or an inorganic light emitting diode display panel.

The display panel DP has a display area for representing the video information, and a sensing area (or image sensing area) SA. The sensing area SA is defined in the display area for detecting the image of an object. For example, for fingerprint sensing, the sensing area SA may be an area contacting or touching the user's fingerprint thereon.

A cover plate CG is disposed on the upper side (or image displaying side) of the display panel DP. The cover plate CG may be attached on the upper side of the display panel DP with an optical adhesive OCA. A barrier film BF is disposed at the rear surface of the display panel DP. The barrier film BF may have slightly larger area than the display panel DP, so that a plurality of pads may be disposed at the extra area extruded from the display panel DP for receiving electrical signals from the outside apparatus.

A lens film LF is attached at the rear side of the barrier film BF. The lens film LF may have a thin base film. The base film of the lens film LF has a condensing lens LE at the area corresponding to the sensing area SA. The condensing lens LE may have a plurality of micro lens arrayed in a matrix manner. Otherwise, the condensing lens LE may have a Fresnel lens corresponding to a convex lens. The Fresnel lens is much thinner than the convex lens with the same optical properties.

A barrier plate BP is attached on the rear surface of the lens film LF. The lens film LF is disposed between the display panel DP and the barrier plate BP. The barrier plate BP is for sustaining or supporting the display panel DP. When the rigid display panel, the barrier plate BP may be a hard or rigid panel. When the display panel DP is for a flexible display, then the barrier plate BP may be a film of which thickness is thin ensuring the flexibility but it has sufficient toughness or hardness.

The barrier plate BP has a light transparent area LT corresponding to the sensing area SA. The light transparent area LT may be formed as a window or a well shape by removing a portion of the barrier plate BP. In that case, the light transparent area LT may be filled with the air. As the air has the lower refractive index than the condensing lens LE or the barrier plate BP, the light transparent area LT can be a space for enhancing the condensing efficiency of the sensing lights by the difference of the refractive index. Otherwise, the light transparent area LT may be filled with a transparent resin material. In this case, the transparent resin material may have a lower refractive index than the condensing lens LE or the barrier plate BP.

A light sensor SE is disposed at the rear side of the barrier plate BP as corresponding to the light transparent area LT. The light sensor SE may be disposed within the light transparent area LT corresponding to the sensing area SA. The light sensor SE changes the light signal into the electric signal and then sends the electric signal to the controller. Therefore, the light sensor SE may be mounted on the circuit board. In the present disclosure, the light sensor SE is mounted at one side of the flexible circuit board (or flexible circuit film) COF connected to the display panel DP. To do so, the flexible circuit board COF further includes various electrical circuits for receiving and sending the electrical signal from the light sensor SE.

The cover plate CG, the display panel DP, the lens film LF, the barrier plate BP and the light sensor SE are disposed in the cover bottom CB. The cover bottom CB may have a vessel shape for accommodating these elements therein.

Hereinafter, the mechanism for recognizing a finger print at the organic light emitting diode display embedding an optical image sensor shown in FIG. 1 is illustrated with reference to FIG. 2.

The display panel DP may be a self-luminance type display such as an organic light emitting diode display. The display panel DP generates light for representing video information in the normal direction of the cover plate CG. When an image object IM is placed at the sensing area SA on the upper surface of the cover plate CG, the reflected light by the image object IM passes through the display panel DP and goes to the rear side of the display panel DP.

For example, when the image object IM is a fingerprint, the ridge R is directly contacted on the upper surface of the cover plate CG. However, the valley V is not contacted on the upper surface of the cover plate CG. Therefore, the light reached to the ridge R is reflected but the light reached to the valley V refracted out of the cover plate CG. The reflected light by the ridge R is condensed by the condensing lens LE disposed as corresponding to the sensing area SA. And then, the light condensed by the condensing lens LE is sent to the light sensor SE facing the condensing lens LE. Combining the light reflected by the ridge R, the light sensor SE reproduces the image of the finger print and converts the reproduced image into an electrical signal. The electrical signal is sent to the controller or computing means.

Here, the cover plate CG and the display panel DP may be attached by an optical adhesive having a superior light transparent property. The reason is that the reflected light by the image object IM should be sent to the light sensor SE without or minimized loss of the light.

<Second Aspect>

Figure 3:
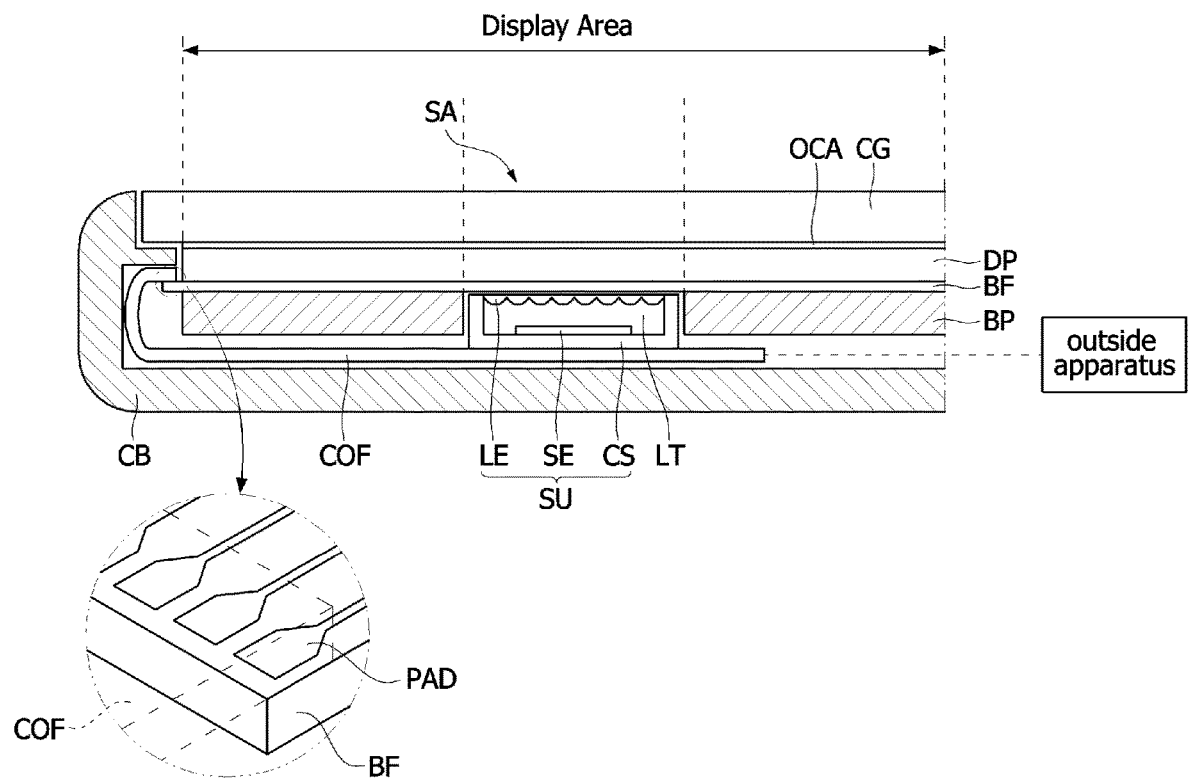
FIG. 3 is a cross-sectional view illustrating a structure of an organic light emitting diode display embedding an optical image sensor according to a second aspect of the present disclosure.

Hereinafter, a second aspect of the present disclosure will be described with reference to FIG. 3. FIG. 3 is a cross-sectional view illustrating a structure of an organic light emitting diode display embedding an optical image sensor according to the second aspect of the present disclosure.

Referring to FIG. 3, a flat panel display embedding an optical image sensor according to the second aspect comprises a display panel DP and a light sensor SE disposed at the rear side of the display panel DP. The display panel DP may include a self-luminance type display panel such as an organic light emitting diode display panel or an inorganic light emitting diode display panel.

The display panel DP has a display area for representing the video information, and a sensing area SA. The sensing area SA is defined in the display area as for detecting the image of an object. For example, for fingerprint sensing, the sensing area SA may be an area contacting or touching the user's fingerprint thereon.

A cover plate CG is disposed on the upper surface (or upper side displaying an image) of the display panel DP. The cover plate CG may be attached on the upper surface of the display panel DP with an optical adhesive OCA. A barrier film BF is disposed at the rear surface of the display panel DP. The barrier film BF may have slightly larger area than the display panel DP so that a plurality of pads may be disposed at the extra area extruded from the display panel DP for receiving electrical signals from the outside apparatus.

A barrier plate BP is attached on the rear side of the barrier film BF. The barrier plate BP is for supporting or sustaining the display panel DP. The different point from the first aspect is that the lens film LF is not directly contacted on the rear surface of the barrier film BF. In the second aspect, a light sensor unit SU includes the condensing lens LE and the light sensor SE.

The barrier plate BP has a light transparent area LT corresponding to the sensing area SA. The light transparent area LT may be formed as a window or a well shape by removing some portions of the barrier plate BP.

The light sensor unit SU is mounted at the rear side of the barrier plate BP as corresponding to the light transparent area LT. Specifically, inside of the light transparent area LT corresponding to the sensing area SA, some portions of or all portions of the light sensor unit SU is inserted. The light sensor unit SU includes a sensor housing CE, a condensing lens LE and a light sensor SE.

The sensor housing CS may have a vessel shape of which upper surface is opened. For example, the sensor housing CS may be a cubic shape or cylindrical shape of which upper side is opened. The condensing lens LE may be disposed at the upper side of the sensor housing CS. The light sensor SE may be disposed at the inside bottom surface of the sensor housing CS.

The sensor housing CS may be inserted into the light transparent area LT formed at the barrier plate BP. The height of the sensor housing CS is equal to or smaller than the thickness of the barrier plate BP, all portions of the sensor housing CS are inserted into the light transparent area LT. Otherwise, when the height of the sensor housing CS is greater than the thickness of the barrier plate BP, some portions of the sensor housing CS are inserted into the light transparent area LT.

The condensing lens LE is apart from the light sensor SE with a predetermined distance. The air is filled within the space between the condensing lens LE and the light sensor SE. As the air has a lower refractive index than the condensing lens LE, the condensing efficiency can be enhanced. In some cases, a transparent resin material of which refractive index is lower than the condensing lens LE may be filled within the space between the condensing lens LE and the light sensor SE.

In the second aspect, like the first aspect, the light sensor unit SU may be mounted at one side of the flexible circuit board COF connected to the display panel DP. To do so, the flexible circuit board COF further includes various electrical circuits for receiving and sending the electrical signal from the light sensor unit SU.

The cover plate CG, the display panel DP, the lens film LF, the barrier plate BP and the light sensor unit SU are disposed in the cover bottom CB. The cover bottom CB may have a vessel shape for housing these elements therein.

<Third Aspect>

Figure 4:
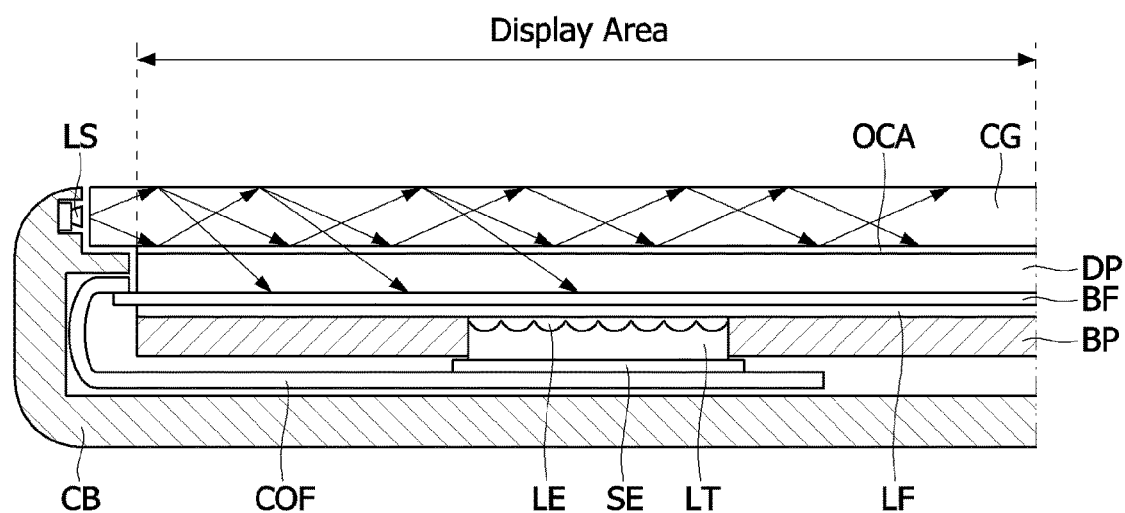
FIG. 4 is a cross-sectional view illustrating a structure of an organic light emitting diode display embedding an optical image sensor according to a third aspect of the present disclosure.

Hereinafter, a third aspect of the present disclosure will be described with reference to FIG. 4. FIG. 4 is a cross-sectional view illustrating a structure of an organic light emitting diode display embedding an optical image sensor according to the third aspect of the present disclosure.

In the first and the second aspects, the lights radiated from the electro luminance display such as the organic light emitting diode display or the inorganic light emitting diode display for representing the video image are used the lights for sensing the image of the object. In these cases, it may be hard to get exact images because the lights do not have intensity enough to detect the correct image. In order to compensate the image detection ability, a light source for image sensing may be further included.

Referring to FIG. 4, a flat panel display embedding an optical image sensor according to the third aspect comprises a display panel DP, a light sensor SE disposed at the rear side of the display panel DP, a cover plated CG attached on the upper surface of the display panel DP, and a light source LS for sensing an image. The display panel DP may include a self-luminance type display panel such as an organic light emitting diode display panel and an inorganic light emitting diode display panel.

The display panel DP has a display area for representing the video information, and a sensing area SA. The sensing area SA is defined in the display area as for detecting the image of an object. For example, for fingerprint sensing, the sensing area SA may be an area contacting or touching the user's fingerprint thereon.

The cover plate CG is disposed on the upper surface of the display panel DP. The light source LS for sensing an image is disposed at one side of the cover plate CG. The light source LS for sensing image may include ultraviolet light. The display panel DP provides the visible lights of which the wavelength range is about 400 nm~700 nm. When the light source LS for sensing image provides the visible lights, the video information provided from the display panel DP may be hindered or distorted. In addition, the light source LS for sensing an image may be inserted into the cover bottom CB.

A barrier film BF is disposed at the rear surface of the display panel DP. The barrier film BF may have slightly larger area than the display panel DP so that a plurality of pads may be disposed at the extra area extruded from the display panel DP for receiving electrical signals from the outside apparatus.

A lens film LF is disposed at the rear side of the barrier film BF. The lens film LF may have a thin base film. The base film of the lens film LF has a condensing lens LE at the area corresponding to the sensing area SA. The condensing lens LE may have a plurality of micro lens arrayed in a matrix manner. Otherwise, the condensing lens LE may have a Fresnel lens corresponding to a convex lens. The Fresnel lens is much thinner than the convex lens with the same optical properties.

A barrier plate BP is attached on the rear surface of the lens film LF. The barrier plate BP is for sustaining or supporting the display panel DP. When the rigid display panel, the barrier plate BP may be a hard or rigid panel. When the display panel DP is for a flexible display, then the barrier plate BP may be a film of which thickness is thin ensuring the flexibility but it has sufficient toughness or hardness.

The barrier plate BP has a light transparent area LT corresponding to the sensing area SA. The light transparent area LT may be formed as a window or a well shape by removing some portions of the barrier plate BP. In that case, the light transparent area LT may be filled with the air. As the air has the lower refractive index than the condensing lens LE or the barrier plate BP, the light transparent area LT would be a space for enhancing the condensing efficiency of the sensing lights by the difference of the refractive index. Otherwise, the light transparent area LT may be filled with a transparent resin material. In this case, the transparent resin material may have a lower refractive index than the condensing lens LE or the barrier plate BP.

A light sensor SE is disposed at the rear side of the barrier plate BP as corresponding to the light transparent area LT. The light sensor SE may be disposed within the light transparent area LT corresponding to the sensing area SA. The light sensor SE changes the light signal into the electric signal and then sends the electric signal to the controller. Therefore, the light sensor SE may be mounted on the circuit board. In the present disclosure, the light sensor SE is mounted at one side of the flexible circuit board COF connected to the display panel DP. To do so, the flexible circuit board COF further includes various electrical circuits for receiving and sending an electrical signal from the light sensor SE.

The cover plate CG, the display panel DP, the lens film LF, the barrier plate BP and the light sensor SE are disposed in the cover bottom CB. The cover bottom CB may have a vessel shape for housing these elements therein.

In description for the third aspect, the light source LS for sensing an image is further included in the structure of the first aspect. Of cause that the light source LS for sensing an image is further included in the structure of the second aspect.

<Fourth Aspect>

Figure 5:
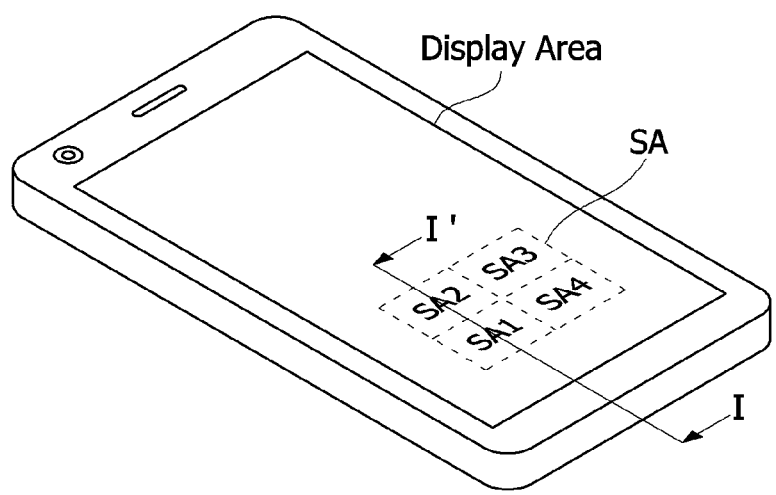
FIG. 5 is a perspective view illustrating a structure of an organic light emitting diode display embedding a plurality of optical image sensors according to a fourth aspect of the present disclosure.
Figure 6:
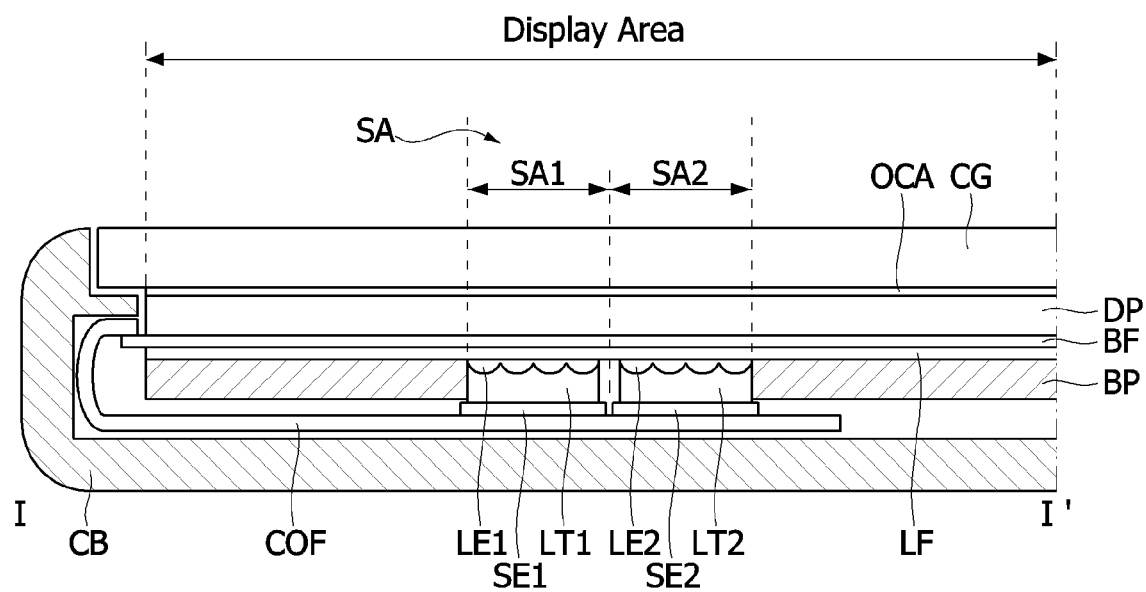
FIG. 6 is a cross-sectional view, along cutting line I-I' in FIG. 5, illustrating a structure of the organic light emitting diode display embedding a plurality of optical image sensors according to the fourth aspect of the present disclosure.

Hereinafter, a fourth aspect of the present disclosure will be described with reference to FIGS. 5 and 6. In the fourth aspect, a plurality of the optical image sensors is included in the flat panel display panel. FIG. 5 is a perspective view illustrating a structure of an organic light emitting diode display embedding a plurality of optical image sensors according to the fourth aspect of the present disclosure. FIG. 6 is a cross-sectional view, along cutting line I-I' in FIG. 5, illustrating a structure of the organic light emitting diode display embedding a plurality of optical image sensors according to the fourth aspect of the present disclosure. Here, a flat panel display embedding a plurality of the optical image sensors applicable to a portable personal device such as the smart phone or the tablet PC is described in the fourth aspect of the present disclosure.

Referring to FIGS. 5 and 6, a flat panel display embedding an optical image sensor according to the fourth aspect comprises a display panel DP and a plurality of light sensors SE1 and SE2 disposed at the rear side of the display panel DP.

The display panel DP has a display area for representing the video information, and a sensing area SA. The sensing area SA is defined in the display area as for detecting the image of an object. For example, for fingerprint sensing, the sensing area SA may be an area contacting or touching the user's fingerprint thereon. Here, in order to increase the accuracy of the image detection or to enlarge the image sensing area, the sensing area SA includes four sub sensing areas SA1 to SA4 arrayed in a matrix manner.

A cover plate CG is disposed on the upper surface (or image displaying side) of the display panel DP. The cover plate CG may be attached on the upper surface of the display panel DP with an optical adhesive OCA. A barrier film BF is disposed at the rear surface of the display panel DP. The barrier film BF may have slightly larger area than the display panel DP so that a plurality of pads may be disposed at the extra area extruded from the display panel DP for receiving electrical signals from the outside apparatus.

A lens film LF is disposed at the rear side of the barrier film BF. The lens film LF may have a thin base film. The base film of the lens film LF has a condensing lens at the area corresponding to the sensing area SA. The condensing lens may have a plurality of micro lens arrayed in a matrix manner. Otherwise, the condensing lens may have a Fresnel lens corresponding to a convex lens. The Fresnel lens is much thinner than the convex lens with the same optical properties.

Specifically, the condensing lens includes a plurality of condensing lenses. For example, a first condensing lens LE1 is disposed as corresponding to the first sensing area SA1, and a second condensing lens LE2 is disposed as corresponding to the second sensing area SA2. Even though it is not shown in figure, a third condensing lens is disposed as corresponding to the third sensing area SA3, and a fourth condensing lens is disposed as corresponding to the fourth sensing area SA4.

A barrier plate BP is attached on the rear surface of the lens film LF. The barrier plate BP is for sustaining or supporting the display panel DP. The barrier plate BP has a light transparent area corresponding to each of the sensing areas SA1 to SA4. The light transparent area may be formed as a window or a well shape by removing some portions of the barrier plate BP.

For example, a first light transparent area LT1 is disposed as corresponding to the first sensing area SA1, and a second light transparent area LT2 is disposed as corresponding to the second sensing area SA2. Even though it is not shown in FIG. 6, a third light transparent area is disposed as corresponding to the third sensing area SA3, and a fourth light transparent area LT4 is disposed as corresponding to the fourth sensing area SA4. The light transparent areas LT1 and LT2 may be filled with the air. As the air has a lower refractive index than the condensing lenses LE1 and LE2 or the barrier plate BP, the light transparent areas LT1 and LT2 can be the spaces for enhancing the condensing efficient of the sensing lights by the difference of the refractive index. Otherwise, the light transparent areas LT1 and LT2 may be filled with a transparent resin material. In this case, the transparent resin material may have a lower refractive index than the condensing lenses LE1 and LE2 or the barrier plate BP.

Light sensor SE1 and SE2 are disposed at the rear side of the barrier plate BP as corresponding to the light transparent areas LT1 and LT2. In detail, a first light sensor SE1 may be disposed as corresponding to the first light transparent area LT1. Further, a second light sensor SE2 may be disposed as corresponding to the second light transparent area LT2. Even though it is not shown in FIG. 6, a third light sensor SE3 may be disposed as corresponding to a third light transparent area LT3, and a fourth light sensor SE4 may be disposed as corresponding to a fourth light transparent area LT4.

The light sensors SE1 and SE2 change the light signals into the electric signals and then send the electric signals to the controller. Therefore, the light sensors SE1 and SE2 may be mounted on the circuit board. In the fourth aspect, the light sensors SE1 and SE2 are mounted at one side of the flexible circuit board COF connected to the display panel DP. To do so, the flexible circuit board COF further includes various electrical circuits for receiving and sending the electrical signals from the light sensors SE1 and SE2. The fingerprint images detected at the four light sensors are combined by the algorithm programmed in the display and then the whole images can be reproduced.

The cover plate CG, the display panel DP, the lens film LF, the barrier plate BP and the light sensor SE are disposed in the cover bottom CB. The cover bottom CB may have a vessel shape for housing these elements therein.

While the aspect of the present disclosure has been described in detail with reference to the drawings, it will be understood by those skilled in the art that the disclosure can be implemented in other specific forms without changing the technical spirit or essential features of the disclosure. Therefore, it should be noted that the forgoing aspects are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. A flat panel display embedding an optical image sensor comprising:
    a display panel including a display area and a sensing area defined in the display area;
    a barrier plate having a light transparent area corresponding to the sensing area and disposed at a rear surface of the display panel;
    a barrier film attaching the barrier plate to the rear surface of the display panel;
    a light sensor disposed under the barrier plate corresponding to the light transparent area; and
    a plurality of pads disposed on a portion of the barrier film which extends beyond the display panel in order to receive electrical signals from an outside apparatus.

2. The flat panel display according to the claim 1, wherein the light transparent area has a window shape or a well shape.

3. The flat panel display according to the claim 1, wherein the light transparent area is formed by removing a portion of the barrier plate corresponding to the sensing area.

4. The flat panel display according to the claim 1, further comprising a lens film including a condensing lens disposed as corresponding to the sensing area.

5. The flat panel display according to the claim 4, wherein the lens film is disposed between the display panel and the barrier plate.

6. The flat panel display according to the claim 1, wherein the light sensor is attached on an inside bottom surface of a sensor housing.

7. The flat panel display according to the claim 6, further comprising a light source sensing an image disposed at a side of the cover plate.

8. The flat panel display according to the claim 1, further comprising:
    a flexible circuit board attached at the display panel for sending electric signals,
    wherein the light sensor is mounted on the flexible circuit board and corresponding to the light transparent area.

9. The flat panel display according to the claim 1, further comprising a cover plate disposed on the display panel.

10. The flat panel display according to the claim 1, wherein the light transparent area is filled with a material having a lower refractive index than the barrier plate.

11. The flat panel display according to the claim 1, wherein the display panel includes an organic light emitting diode display or an inorganic light emitting diode display.

12. The flat panel display according to the claim 1, wherein the sensing area includes a first sensing area and a second sensing area;
    wherein the light transparent area includes a first light transparent area corresponding to the first sensing area, and a second light transparent area corresponding to the second sensing area; and
    wherein the light sensor includes a first light sensor disposed as corresponding to the first light transparent area, and a second light sensor disposed as corresponding to the second light transparent area.

13. A flat panel display having an integrated optical image sensor comprising:
    a display panel including a display area and a sensing area in the display area;
    a barrier plate including a light barrier area corresponding to outside the sensing area and disposed at a non-image displaying surface of the display panel;
    a barrier film attaching the barrier plate to the non-image displaying surface of the display panel;
    a condensing efficiency enhancing area in a space of the barrier plate corresponding to the sensing area;
    a light sensor corresponding to the condensing efficiency enhancing area; and
    a plurality of pads disposed on a portion of the barrier film which extends beyond the display panel in order to receive electrical signals from an outside apparatus.

14. The flat panel display according to claim 13, wherein the condensing efficiency enhancing area is transparent with respect to light.

15. The flat panel display according to the claim 13, wherein the condensing efficiency enhancing area has a lower refractive index than the barrier plate.

16. The flat panel display according to the claim 15, wherein the condensing efficiency enhancing area is filled with air or a transparent resin.

17. The flat panel display according to the claim 13, further comprising a plurality of condensing lenses spaced apart from and facing the light sensor in the condensing efficiency enhancing area.

18. The flat panel display according to the claim 17, further comprising a sensor housing accommodating the plurality of condensing lenses and the light sensor in the condensing efficiency enhancing area.

19. The flat panel display according to the claim 17, further comprising a lens film having the plurality of condensing lens and disposed between barrier film and the barrier plate.

20. The flat panel display according to the claim 13, further comprising a flexible circuit board attached to the light sensor and electrically connected to the display panel.

21. The flat panel display according to the claim 13, further comprising cover plate disposed on the display panel.

22. The flat panel display according to the claim 21, further comprising a light source at a side of the cover plate.

23. The flat panel display according to the claim 13, further comprising a cover bottom accommodating the cover plate, the display panel, the lens film, the barrier plate and the light sensor.

* * * * *